United States Patent [19]

Kurumada et al.

[11] 4,331,967
[45] May 25, 1982

[54] FIELD EFFECTS SEMICONDUCTOR DEVICES

[75] Inventors: Katsuhiko Kurumada, Tokyo; Kazuyoshi Asai, Iruma; Yasunobu Ishii, Hoya, all of Japan

[73] Assignee: Nippon Telegraph & Telephone Public Corp., Japan

[21] Appl. No.: 117,186

[22] Filed: Jan. 31, 1980

[30] Foreign Application Priority Data

Nov. 28, 1979 [JP] Japan ............................. 54/152888

[51] Int. Cl.³ ................................................ H01S 3/18
[52] U.S. Cl. ............................................ 357/3; 357/22
[58] Field of Search .......................................... 357/3, 22

[56] References Cited

U.S. PATENT DOCUMENTS

| | | | |
|---|---|---|---|
| 3,531,698 | 9/1970 | Atalla | 357/3 |
| 3,585,520 | 6/1971 | Yanai | 357/3 |
| 3,600,705 | 8/1971 | Tantraporn | 357/3 |
| 3,701,043 | 10/1972 | Zuleeg et al. | 357/3 |
| 3,991,328 | 11/1976 | Upadhyayula | 357/3 |

*Primary Examiner*—R. A. Rosenberger
*Attorney, Agent, or Firm*—Townsend and Townsend

[57] ABSTRACT

In a field effect semiconductor device comprising a semi-insulator layer composed of a semiconductor material, an N conductivity type active layer made of the same semiconductor material and acting as a channel, spaced cathode and anode electrodes formed on the active layer, the cathode electrode being in ohmic contact with the active layer, and means for applying drive voltage across the cathode and anode electrodes for varying the electrons flowing through the active layer so as to vary output current, a P conductive region is provided beneath the anode electrode and extending through the active layer toward to or penetrating into the semiconductor layer.

5 Claims, 12 Drawing Figures

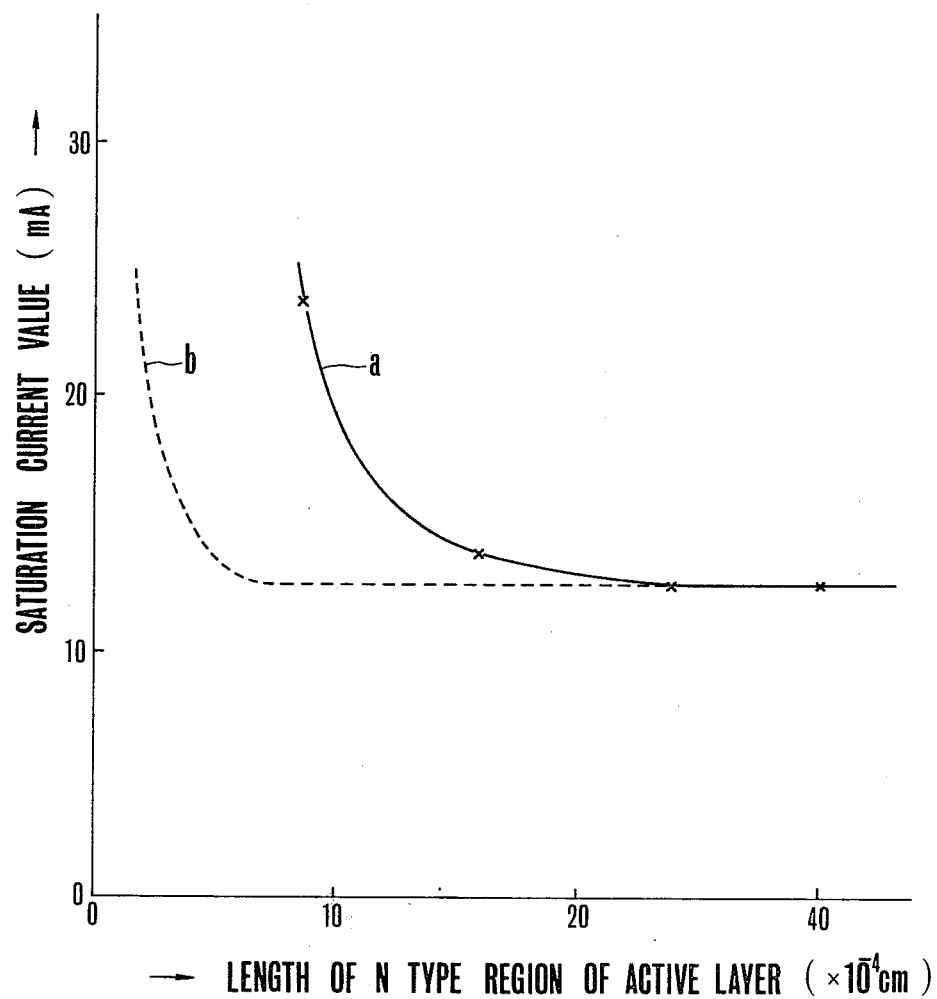

F I G.10
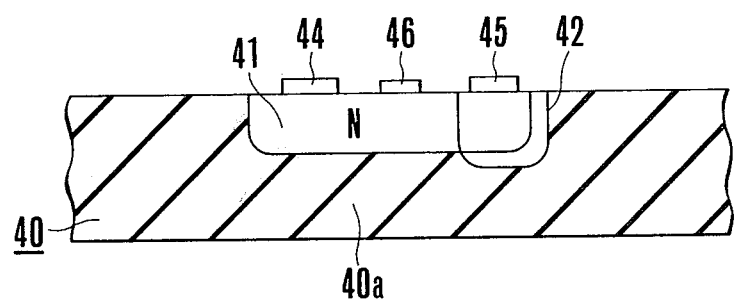

FIELD EFFECTS SEMICONDUCTOR DEVICES

BACKGROUND OF THE INVENTION

This invention relates to a field effect semiconductor device, more particularly a field effect semiconductor device comprising a semiinsulator layer composed of such a relatively high resistivity semi-conductor material, such as a P−, N−, or I type material, an N type active layer adjacent to the semiinsulator layer made of the same material as the semiconductor and acting as a channel, a cathode electrode and an anode electrode which are disposed on the surface of the active layer, and means for varying the electron current flowing through the active layer by impressing voltage between the cathode and anode electrodes so as to vary the current through the active layer, wherein the cathode electrode is in ohmic contact with the active layer.

Among the semiconductor devices of the type referred to above are three terminal devices such as a junction type, MIS (metal insulated semiconductor) type and MES (metal semiconductor) type, and two terminal devices such as a planar type Gunn diode. The problems discussed hereinbelow occur in any one of the types, but for the sake of illustration a planar type Gunn diode will be described as a typical example.

As disclosed in the technical publication authored by Masakazu Shoji entitled "Improvement of Reliability of Gunn Diodes", Proceedings of the IEEE, Feb. 1969 pages 250 and 251, in a planar type Gunn diode, such III–V group compound semiconductors as gallium-arsenide and indium-phosphide are used as a channel active layer and the cathode and anode electrodes are connected to the channel active layer with an ohmic contact, the cathode and anode electrodes being located at a definite spacing on the channel active layer. This Gunn diode generally has a characteristic that upon application of a bias voltage across the anode and cathode electrodes, the current increases in proportion to the applied voltage while the field is weak but as the field in the active layer increases beyond the threshold field for the Gunn effect of about 3.5 KV/cm, the current saturates with instantaneous current oscillation.

The mechanism of the above oscillation is explained as follows: one cycle of the oscillation corresponds to (i) nucleation of the Gunn domain around the cathode area, (ii) its transit through the channel and (iii) its vanishing around the anode area. Repetition of the above cycle is the oscillatory change of the output current as RF output current.

Since the impedance of the Gunn domain is inherently high, the current through the channel decreases when the Gunn domain nucleates and this lower level of the current (valley current level) persists until the Gunn domain diminishes; i.e. the current increases to the previous saturated level again at the instance of the Gunn domain vanishing around the anode area. If a Gunn diode is biased just below the threshold (just below the saturated current level) for Gunn effect, an input of a trigger pulse, which can increase the field in the active layer beyond the threshold field for the Gunn effect, will produce the Gunn domain. The above trigger mode operation of a Gunn diode can perform a kind of pulse regeneration useful in digital signal processing devices.

If a Gunn diode is biased so high that the field in the active channel is above the threshold field for the Gunn effect, the diode works as a continuous wave oscillator.

In the above description, trigger mode operation and continuous oscillation mode operation are explained for a Gunn diode. For these two modes of operation, the RF output current is given by difference of current levels between the above mentioned saturated current level and the valley current level. The ratio of the above difference between the both current levels to the saturated current level itself is called the current drop ratio.

In reality, a conventional planar Gunn diode produces smaller RF output compared to the theoretical value, moreover, its frequency spectra contains a considerable fraction of undesirable noise. In addition the bias voltage necessary to produce the Gunn effect is larger than the theoretically expected value and this larger required bias voltage causes a burn out phenomenon around the anode electrode, especially between the anode electrode and the immediately underlying active layer.

It should be noted that the above mentioned characteristic deviations of the conventional planar type Gunn diode from the theoretically expected characteristics become relatively more prominent under DC bias operation when compared to the case of pulse bias operation.

For this reason, the expected usefulness of a Gunn diode as a frequency element operating at high frequencies higher than microwave frequencies has been difficult to realize practically.

Various analyses have been made to solve these problems and the following two phenomena were noted.

The first phenomenon is that upon application of a voltage across the anode and cathode electrodes, a stable Gunn domain stays around the anode area, where electrons flow from the N type active channel layer to the N+ area under the anode electrode in which electrons concentrate. The generation of such a phenomenon was reported by Shinya Hasuo et al in their technical publication entitled 'Influence of Carrier Diffusion on an Anode Trapped Domain Formation in a Transferred Electron Device", I.E.E.E Transaction Electron Devices, Ed-23, 1976, pages 1063–1069. The occurrence of this phenomenon results in an increase in the internal resistance of the device.

The other phenomenon is that the space charge layer of a NN− or NP− or a NI transition region formed between a semiinsulator substrate and an active layer thereon when a normal bias voltage is impressed across the anode and cathode electrodes tends to increase. More particularly, in the vicinity of the anode electrode where electric flux crosses the interface from the active layer to the semiinsulating substrate, a positively charged space charge layer consisting of donors alone is formed on the side of the active layer of the transition region, whereas on the side of the semiinsulator substrate a negatively charged space charge layer is formed. The cause of generation of negative space charge in the side of semiinsulator substrate facing the positive space charge in the active layer side is natural in the case of an NP− combination for the active layer-semiinsulator structure, because the bias between the anode electrode and cathode electrode results in the application of a reverse bias onto the NP− junction in the vicinity of the anode electrode where electric flux invades into the semiinsulating substrate. But if the semiinsulating substrate is N− or I type, the cause of generation of negative space charge in the semiinsulating substrate is not necessarily straightforward. The tendency of negative charging for an N− or I type substrate is explained by the existence of electron trapping centers contained in real crystal and this phenomenon of negative charging in substrates has been reported by T. Itoh et al in their technical publication entitled "Interface Effects on Drain Current Instabilities in GaAs MESFETs with Buffer Layer", Digest of Technical Papers, The 11th Conference on Solid State Devices, Tokyo, 1979, pages 85 and 86. For this reason, a certain number of electrons which invade into the semiinsulator substrate tend to be trapped by the space charge layer formed in the semiinsulator substrate. The above growth of negative charge in the semiinsulating substrate side induces an enhanced growth of positive space charge in the facing active layer side. For this reason, the internal resistance of the device is increased. The latter phenomenon narrows the flowing path of the electrons in the active layer near and below the anode electrode thereby enhancing an increase in the internal resistance of the active layer. Due to concurrent occurrence of these two phenomena, the entire active layer near the anode electrode becomes a space charge layer, so that even when the voltage impressed across the anode and cathode electrodes is increased the increment thereof merely contributes to the growth of the space charge layer, with the result that it becomes impossible to prevent a rapid increase of the field in the active layer and thereby to realize a fast travelling state of sufficiently accelerated electrons. For this reason, the saturation value of the current available at the output of the device is undesirably limited. At the same time, the growth of the space charge layer increases the field near the anode electrode thus causing ultimate rupture of the device.

SUMMARY OF THE INVENTION

Accordingly it is a principal object of this invention to provide a field effect semiconductor device provided with an active layer formed on a semiinsulator substrate to operate as a channel and capable of increasing the RF output current over prior art devices.

Another object of this invention is to provide a field effect semiconductor device capable of using efficiently the active layer even in the presence of a high field intensity.

Still another object of this invention is to provide a field effect semiconductor device that will not rupture even when it is operated in a high intensity direct current field.

Yet another object of this invention is to provide a field effect semiconductor device having a wider dynamic range than prior art devices.

A further object of this invention is to provide a field effect semiconductor device capable of being minimized in size by eliminating the persistence of a high intensity electric field Gunn domain formed near an anode electrode as well as a back gate effect.

Still further object of this invention is to provide a field effect semiconductor device capable of producing an oscillation due to the Gunn effect when operated either in a direct current mode or a pulse mode.

Another object of this invention is to provide a field effect semiconductor device capable of forming a microwave oscillator operating at higher frequencies than prior art devices.

Still another object of this invention is to provide a field effect semiconductor device that can form a microwave oscillator capable of operating at a desired frequency with drive voltage lower than that of prior art devices.

According to this invention there is provided a field effect semiconductor device of the type comprising a semiinsulator layer composed of a semiconductor material having a relatively high resistivity, an N conductivity type active layer formed contiguous to the semiinsulator layer and made of the same material as the semiconductor material, the N conductivity type active layer acting as a channel, a cathode electrode and an anode electrode which are disposed on a surface of the active layer with a predetermined distance therebetween, the cathode electrode being in an ohmic contact with the active layer, and wherein voltage is applied between the anode and cathode electrodes to vary electron current flowing through the active layer, characterized by a P conductivity region of different conductivity type from that of the active layer, the P conductivity type region extending from a surface of the active layer beneath the anode electrode into the active layer by a predetermined depth.

The semiinsulator layer is composed of an $N^-$, $P^-$ or I type and the P conductivity type region reaches or penetrates into the semiinsulator layer. A PN junction formed between the active layer and the P conductivity region is formed to readily accept electrons travelling from the cathode electrode to effectively decrease the electron concentration around the anode by electron-hole recombination in order to prevent growth of a space charge layer and to prevent an increase of internal resistance caused by a bias voltage impressed between the anode and cathode electrodes.

So long as the P conductivity type region is formed to such depth that the holes in this P conductivity type region can diffuse to the interface between the active layer and the semiinsulator layer through the portion of the active layer beneath the P conductivity region, a region of the semiinsulative layer which is charged negatively at the time of applying the bias voltage can be neutralized by the holes. For this reason, the P conductivity type region may either terminate a short distance from the interface between the active layer and the semiinsulator layer, or reach the interface, or penetrate into the interface. With this construction, the above described defects of the prior art devices are eliminated.

BRIEF DESCRIPTION OF THE DRAWINGS

In the accompanying drawings:

FIG. 4 is a graph showing the relationship between the N type region length of the active layer of the semiconductor device according to this invention and the saturation output current value thereof;

FIG. 10 is a sectional view showing still another modification of the field effect semiconductor device embodying the invention.

DESCRIPTION OF THE PREFERRED EMBODIMENTS

Figure 1:
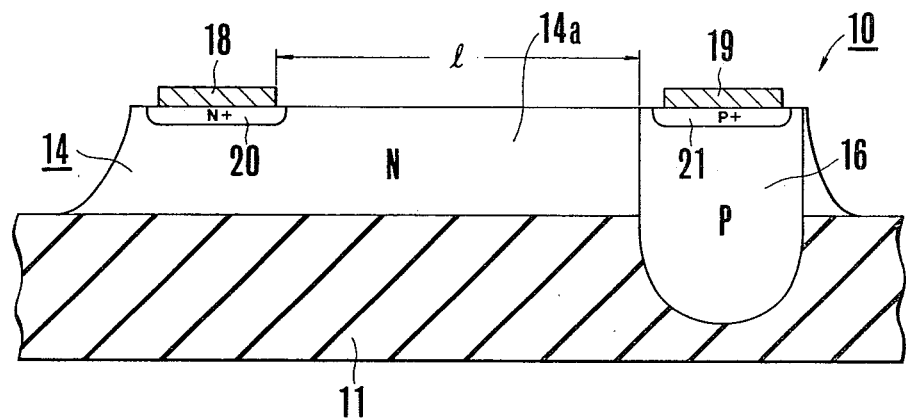
FIG. 1 is a sectional view showing one embodiment of the field effect semiconductor device according to this invention.

Referring now to the accompanying drawings, FIG. 1 illustrates one embodiment of a field effect semiconductor device according to this invention, more particularly a planar type Gunn diode. The semiconductor device 10 shown comprises a high resistance semiinsulator substrate 11 of the $N^-$, $P^-$ or I type composed of a bulk crystal of gallium-arsenide compound doped with chromium. On the semiinsulator substrate 11 is an active layer 14 formed by the vapor phase epitaxial growth technique and composed of a gallium-arsinide type crystal doped with silicon to act as a channel. The electron concentration is about $10^{15}$–$10^{17}$ cm$^{-3}$ and the thickness of the active layer is about 0.1–2.0$\times 10^{-4}$ cm. When formed by the vapor phase growth method, the active layer 14 is first formed over the entire surface of the substrate 11 and the active layer is then etched off except for a portion thereof on which a device of this invention is to be formed. Accordingly, the active layer 14 shown in FIG. 1 takes the form of a mesa.

After the active layer 14 has been formed, ions of beryllium are implanted into a portion at which an anode electrode 19 is then to be formed under an acceleration voltage of 100 KeV and a dose of $5\times 10^{14}$ cm$^{-2}$.

The substrate is annealed at a temperature of 700° C. for 20 min so as to form a P region 16 which extends from the main surface into the semiinsulator substrate 11 through the active layer 14. In this case, the peak concentration of holes in the P region 16 is $2\times 10^{19}$ cm$^{-3}$. It should be understood that it is not necessary for the P region 16 to penetrate deeply into the substrate 11 and region 16 may merely reach the surface of the substrate 11. Even with the latter construction it is possible to prevent formation of a negatively charged space charge layer. Further, in certain cases, the P region 16 is not required to reach the interface between the semiinsulator substrate 11 and the active layer 14. Thus, so long as the surface of the semiinsulator substrate presents within the hole diffusion length therein the holes injected into a portion of the active layer 14 between the P region 16 and the semiinsulator substrate 11 would reach a similar substrate neutralizing the negatively charged region adjacent to the interface.

Next, an alloy of Au-Ge-Ni is deposited to form a cathode electrode 18 and an anode electrode 19. The anode electrode 19 is formed in the P region 16 and does not extend beyond it, whereas the cathode electrode 15 is formed on the main surface at a point spaced from the anode electrode 19 by a predetermined distance, $55\times 10^{-4}$ cm for example. Then the deposited alloy is sintered for 10 seconds at 500° C. to form high concentration contact regions 20 and 21 beneath the cathode and anode regions 18 and 19 respectively. The distance between the cathode electrode 18 and the P region 16 (a PN junction) formed in this manner, that is the length l of the N type region, is $40\times 10^{-4}$ cm for example, and the width of the active layer 14 is $40\times 10^{-4}$ cm, for example.

Since the P region 16 is formed beneath and near the anode electrode 19, in other words, since a portion having a high acceptor concentration is formed, electrons flowing from the cathode electrode are readily smoothly absorbed in connection with the P region. In other words, the electrons recombine with the holes near the P region 16 or flow into the P region to reach the anode electrode 19. Consequently, it is possible to prevent the high field Gunn domain from remaining at the portion beneath and near the anode electrode 19 so as not to increase the internal resistance of the device as opposed to the prior art construction. Moreover, since the P region 16 reaches the semiinsulator substrate beneath the active layer, the interface of the semiinsulator substrate will not be charged negatively as in the prior art construction. This efficiently prevents increase in the resistance caused by the space charge layer between the semiinsulator substrate 11 and the active layer 14 at a portion beneath and near the anode electrode 19.

When the high field Gunn domain is prevented from remaining at a portion below and near the anode electrode in a manner as above described, the level of the saturation current rises to near the theoretical value with the result that when the semiconductor device is used in an oscillation mode, the RF output current can be increased, thus improving the current efficiency. Thus, the rate of current drop, expressed by the ratio of the saturation current level to the difference between the saturation current level (peak current) and a valley current, increases.

Figure 2:
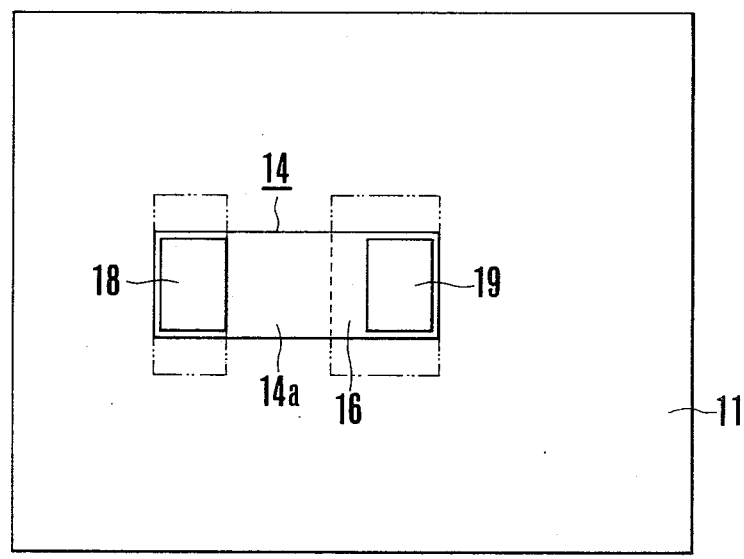
FIG. 2 is a plan view of the device shown in FIG. 1.

In a plan view of the semiconductor device shown in FIG. 2, with the prior art construction the current path is deliberately broadened near the anode electrode as shown by the phantom lines. By adoption of this broadening structure, the chance of direct collision or touch to the anode electrode of the high field Gunn domain running from the cathode area is decreased thus preventing rupture of the anode electrode. This phenomenon is disclosed in a M. Shoji et al paper entitled "Improvement of Reliability of Gunn Diodes," Proceedings of I.E.E.E. Feb. 1969, pages 250–251. In contrast, according to this invention, since the anode electrode 19 is formed on the surface of the P region 16 and the running Gunn domain vanishes before it reaches the P region, it is not necessary to provide any means for preventing the direct collision or touch of the high field Gunn domain as in the prior art construction. Accordingly, the shape of the device may be proportioned as shown by solid lines in FIG. 2, thereby miniaturizing the semiconductor device 10.

Figure 3:
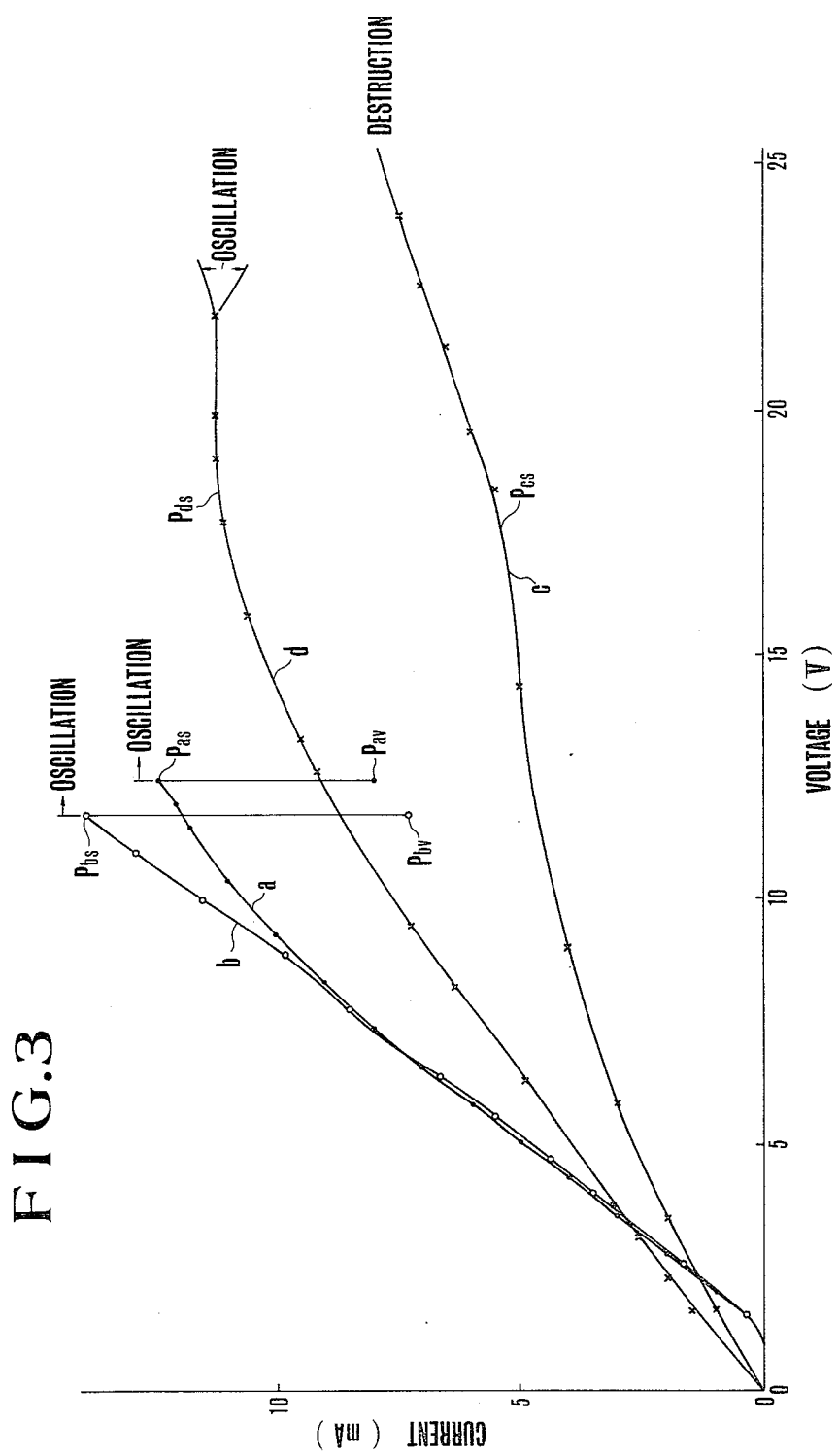
FIG. 3 is a graph showing voltage-current characteristics of the device of this invention and of a prior art device.

The field effect semiconductor device 10 thus obtained has voltage-current characteristics as shown by curves a and b shown in FIG. 3 in which curve a shows a case wherein DC bias voltage is applied across the anode electrode 19 and the cathode electrode 18 of the semiconductor device 10, while curve b shows a case wherein a pulse bias voltage having rising gradient of about 20 V/20 ns, and a repetition frequency of 100 KHz was impressed across the anode and cathode electrodes. FIG. 3 also shows the voltage-current characteristics c and d of a prior art field effect semiconductor device not provided with the P region 16 in which curve c shows a case wherein DC bias voltage was impressed across the electrodes, whereas curve d shows a case where the same pulse bias voltage as that described above was impressed across the electrodes.

As can be clearly noted from FIG. 3 the characteristics a and b of this invention have much larger current than the characteristics c and d for the prior art field effect semiconductor device not provided with the P region. Further, the difference in the RF output current [the difference between the saturation current levels Pas, Pbs and the valley currents Pav, Pbv, that is (Pas- Pav) and (Pbs-Pbv)] for DC bias condition and pulse bias condition is not significantly large, and the value of the RF output current is reasonably equal to the theoretical value whether the semiconductor device is driven by direct current or a pulse. Moreover, in the case of the DC drive it has been difficult to cause the prior art device to oscillate, whereas with the semiconductor device of this invention it is easy to cause the device to oscillate either with DC or pulse drive. In addition, the threshold voltage of the oscillation can be reduced greatly over the prior art device and yet the RF output current can be improved greatly.

Analysis of the characteristic curves from a different standpoint shows that the difference in the value of the saturation current (the current at the threshold voltage) caused by the presence or absence of the increase in the resistance due to the presence and absence of the high electric field Gunn domain which appears near the anode electrode of the prior art semiconductor device is represented by the difference between characteristics b and d, and the decrease in the saturation current value caused by the combined action of the phenomena described above and a space charge layer formed between the semiinsulator substrate and the active layer is represented by the difference between the characteristics a and c.

FIG. 4 shows a saturation current value characteristic when the distance l (hereinafter termed the N type region length) between the cathode electrode 18 and the P region 16 in the active layer 14 of the above described semiconductor device 10 is varied. The DC bias voltage impressed between the anode electrode 19 and the cathode electrode 18 at this time is the voltage corresponding to the saturation current value. As can be noted from FIG. 4, the saturation current value is substantially constant until the N type region length l is reduced to about $24 \times 10^{-4}$ cm. Above this value, the saturation current value is not dependent upon the N type region length l and this level of the current saturation is dominated by electron velocity saturation for the threshold field of Gunn effect, that is the intrinsic property of the N type active layer gives the level of the current saturation. However, when the N type region length l is decreased further, the saturation current value increases rapidly.

Figure 5A:
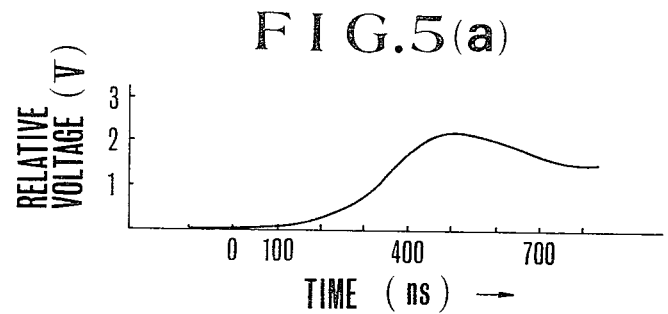
FIG. 5a and 5b show input and output waveforms of the semiconductor device embodying the invention.
Figure 5B:
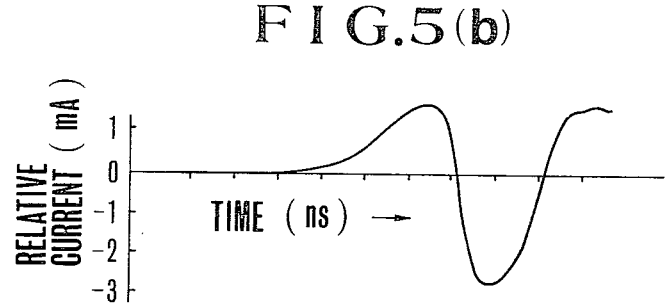

From this, it can be assumed that the following operation occurs in the active layer 14. More particularly, where the length l of the N type region is longer than about $24 \times 10^{-4}$ cm, the output saturation current is substantially constant. Accordingly, in this region, the holes are caused to inject into the N type active layer by the voltage impressed across the cathode and anode electrodes 18 and 19 and travel toward the cathode electrode but diminish before they reach the cathode electrode 18 so that they have no influence upon the saturation current, because the saturation of the current through the active layer occurs at the portion of the active layer at the cathode side, where the holes injected from the anode side do not reach. This fact can be proven by the input-output waveforms shown in FIGS. 5a and 5b. Thus, where a positive trigger pulse voltage as shown in FIG. 5a is applied to the anode electrode 19 superimposed on the DC bias level, an RF output waveform as shown in FIG. 5b can be obtained. This RF output current waveform shows that the Gunn domain generated near the cathode electrode when the trigger pulse voltage is applied travels toward the anode electrode and further that the domain diminishes without disturbing the waveform even in the presence of a large number of holes. The amplitude of the current drop associated with maturing of the Gunn domain is about 4 mA. The decrease of the current is about 30% of the saturation level, that is the ratio of current drop is about 30% which is satisfactory in DC bias operation.

When the length l of the N type region is shorter than $24 \times 10^{-4}$ cm, the saturation current begins to increase gradually, that is exponentially. This means that with the length of the N type region shorter than about $24 \times 10^{-4}$ cm it is considered that the holes in P region 16 travel through the N type region and reach the cathode electrode 18. This means that it may be considered that the characteristic a shown in FIG. 4 can be changed to b shown by dotted lines by decreasing the amount of the impurity doped into the P region or by increasing the amount of the impurity doped into the N type region 14a. This means that it is possible to miniaturize the field effect semiconductor device to obtain a small sized semiconductor device that can be used as a high frequency microwave oscillator.

Figure 6:
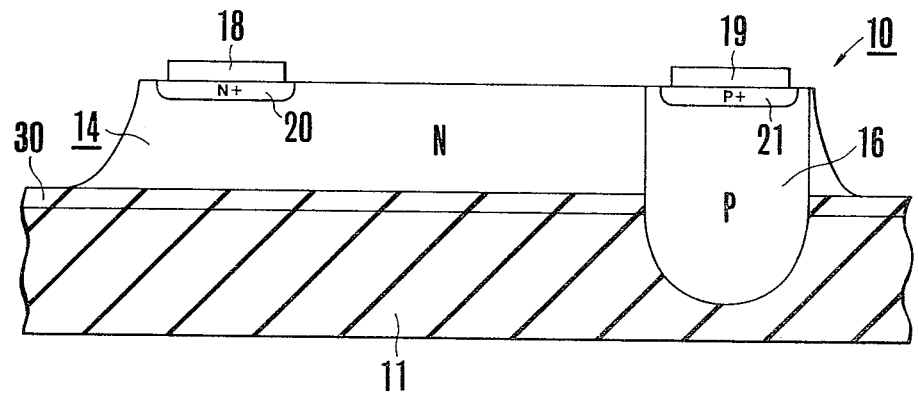
FIGS. 6, 7 and 8 show alternate embodiments of this invention.

Although in the foregoing embodiment an N type active layer utilized as a channel was formed directly on a semiinsulator substrate, a semiinsulator substrate composed of GaAs, for example, generally contains a large quantity of impurities e.g. chromium and physical defects, so that its quality is not excellent. Accordingly, electron scattering can be caused by lattice defects or impurity ions so that there is a tendency for the mobility of electrons which travel near the interface between the active layer and the insulator substrate to increase. Consequently, it is advantageous to form a high quality semiinsulator layer, or a buffer layer 30 (FIG. 6) on the semiinsulator substrate 11, composed of a bulk crystal of GaAs doped with chromium. The buffer layer 30 may be of $N^{-1}$, $P^-$ or I type and is preferred to have an electron or hole concentration of less than $10^{14}$ cm$^{-3}$. As an example the high resistivity buffer layer 30 can be formed by vapor phase epitaxial growth technique. At this time care should be taken that the GaAs should not contain any or only a little amount of impurities.

Figure 7:
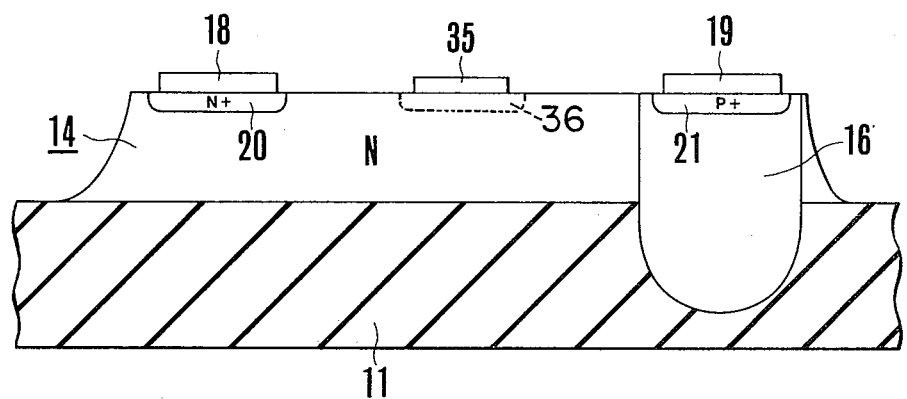
Figure 8:
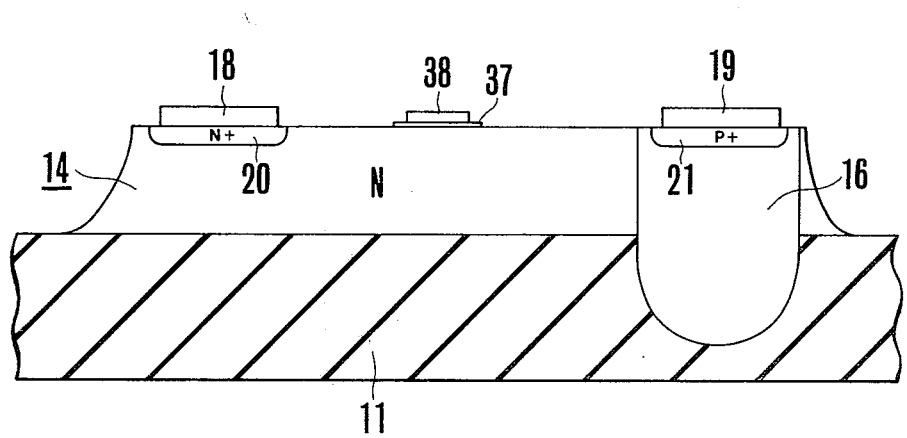

While the above embodiment has been described in terms of a two terminal field effect semiconductor device, it should be understood that the invention is also applicable to a three terminal semiconductor device having a control electrode. FIGS. 7 and 8 illustrate such modifications in which the former shows a junction type or MES type field effect transistor, while the latter a MIS type field effect transistor. These transistors are similar to that shown in FIG. 1 except that in FIG. 7 a control electrode 35 is provided while in FIG. 8 a control electrode 38 is provided through an insulating film 37.

And in the case of the junction type, the control electrode is provided on a P region 36 which locates only in the surface beneath the control electrode.

Figure 9A:
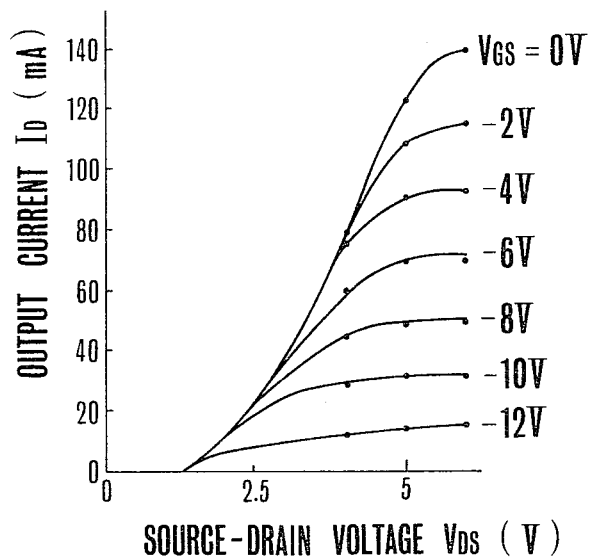
FIGS. 9a and 9b are graphs respectively showing the voltage-current characteristics of the device of this invention and of the prior art device.
Figure 9B:
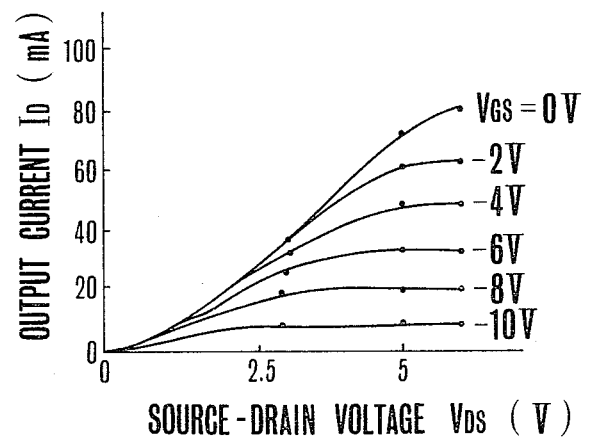

The voltage current characteristics of such three terminal field effect transistors are shown in FIG. 9a while FIG. 9b shows the voltage-current characteristics of a conventional three terminal semiconductor device not provided with the P region around the anode. These curves were obtained for N channel field effect transistors in which the thickness of the active layer was 0.5 micron, the donor concentration was $8.2 \times 10^{16}$ cm$^{-3}$, the distance between the cathode electrode 18 (that is the source electrode in the case of an N channel field effect transistor) and the P region 16 was 16 microns, and in which the voltage $V_{GS}$ between the control electrode 35 (the gate electrode in the case of the N channel field effect transistor) and the cathode electrode 18 (source) is used as a parameter. In FIGS. 9a and 9b the abscissa represents the voltage $V_{DS}$ between the anode electrode 17 (the drain electrode in the case of the N channel field effect transistor) and the cathode (source) electrode, while the ordinate represents the output current $I_D$ in mA. Comparison of these characteristics shows that the semiconductor device of the invention has a larger transconductance and wider dynamic range than the prior art device.

Where the invention is applied to a three terminal field effect semiconductor device of the junction type or MES type construction, holes injected from the P region may flow to the control electrode 35. This can be prevented by interposing an insulator between the control electrode 35 and the active layer 14 or by decreasing the acceptor concentration in the P region.

It should be understood that the invention is not limited to the embodiments described above and that it is applicable to various types of field effect transistors such as three terminal junction type, MIS type or MES type.

Although in the foregoing embodiments, the active layer was grown by using a vapor phase technique on the semiinsulator substrate, as shown in FIG. 10 it is also possible to form an N type active layer 41 having electron concentration of $1 \times 10^{15} - 3 \times 10^{17}$ cm$^{-3}$ on the semiinsulator layer 40a by implanting ions of such a donor as silicon into the semiinsulator substrate 40 at an acceleration voltage of 200 KeV, then forming a P region 42 having a peak concentration of about $1 \times 10^{19}$ cm$^{-3}$ by implanting ions of such an acceptor as beryllium into a selected portion of the active layer 41 at an acceleration voltage of 100 keV and then forming a cathode electrode 44 on the active layer 41 on the main surface of the substrate 40, and an anode electrode 45 on the P region 42. If desired, a control electrode 46 may also be formed, directly on the active layer 41 or via an insulator layer. The ion implantation may be performed by one or more steps. The modified embodiment shown in FIG. 10 has the same advantages as those of the foregoing embodiments.

In the embodiments described above, the anode electrode was formed not to extend beyond the periphery of the P type region 16. However, the anode electrode may extend onto the N type region beyond the periphery of the P type region so long as the voltage drop through the N type region beneath the over-extended anode electrode is smaller than that (about 1 volt) at the PN junction between the P region and the N type region. The extent of protrusion of the anode electrode should be less than 3 microns.

As above described in the field effect semiconductor device embodying the invention, the persistence of high field Gunn domain near the anode electrode and the formation of a space charge layer between the active layer and the semiinsulator layer can be effectively prevented thus increasing the output current. Moreover, it is possible to use at a high efficiency the active layer even in presence of a high field intensity, so that rupture in a high DC field can be prevented. In addition, it is possible not only to make the dynamic range wider than that of the prior art field effect transistor but also to operate the device as an oscillator due to Gunn effect for both pulse drive and DC drive of lower voltage. Further according to this invention it is possible to miniaturize the semiconductor device thereby constructing a microwave oscillator capable of operating at a higher frequency with a smaller size than the prior art device.

What is claimed is:

1. In a field effect semiconductor device of the type comprising a semiinsulator layer composed of a semiconductor material having a relatively high resistivity, an N conductivity type active layer formed contiguous to the semiinsulator layer and made of the same material as said semiinsulator layer, said N conductivity type active layer acting as a channel, a cathode electrode and an anode electrode which are disposed on a surface of said active layer with a predetermined distance therebetween, said cathode electrode being in ohmic contact with said active layer, and means for enabling a voltage to be applied across said anode and cathode electrodes to cause the electron current flowing through said active layer to vary, the improvement which comprises a P conductivity type region of a different conductivity type from that of the active layer, said P conductivity type region extending from a surface of said active layer beneath said anode electrode through said active layer and into said semi-insulator layer to a predetermined depth, said P conductivity type region being surmounted by a P+ type conductivity region underlying said anode electrode.

2. The field effect semiconductor device as defined in claim 1 wherein said enabling means comprises a gate electrode disposed on the surface of said active layer between said cathode and anode electrodes.

3. The field effect semiconductor device according to claim 1 wherein said semiinsulator layer comprises a semiinsulator substrate.

4. The field effect semiconductor device according to claim 1 wherein said semiinsulator layer comprises a bulk crystal of gallium arsenide doped with chromium.

5. The field effect semiconductor device according to claim 1 wherein said semiinsulator layer comprises a portion of a semiinsulator substrate and said active layer is formed by implanting ions of an impurity into said semiinsulator substrate.

* * * * *